United States Patent
Umeda

(10) Patent No.: US 8,624,595 B2
(45) Date of Patent: Jan. 7, 2014

(54) MAGNETIC RESONANCE IMAGING APPARATUS AND MAGNETIC RESONANCE IMAGING METHOD

(75) Inventor: Masaaki Umeda, Sakura (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 421 days.

(21) Appl. No.: 13/116,458

(22) Filed: May 26, 2011

(65) Prior Publication Data

US 2011/0291651 A1    Dec. 1, 2011

(30) Foreign Application Priority Data

May 27, 2010  (JP) .................................. 2010-121911
Apr. 19, 2011  (JP) .................................. 2011-093245

(51) Int. Cl.
*G01V 3/00*  (2006.01)
(52) U.S. Cl.
USPC .......................................... 324/307; 324/309

(58) Field of Classification Search
USPC .......................... 324/300–322; 600/407–445
See application file for complete search history.

(56) References Cited

U.S. PATENT DOCUMENTS

| 5,378,985 | A | 1/1995 | Hinks |
| 6,369,568 | B1 | 4/2002 | Ma et al. |
| 7,365,543 | B2 * | 4/2008 | Yui et al. ........................ 324/318 |
| 7,403,008 | B2 * | 7/2008 | Blank et al. ................... 324/316 |
| 7,825,660 | B2 * | 11/2010 | Yui et al. ....................... 324/306 |

* cited by examiner

*Primary Examiner* — Brij Shrivastav
(74) *Attorney, Agent, or Firm* — Nixon & Vanderhye PC

(57) ABSTRACT

A magnetic resonance imaging apparatus according to an embodiment includes an executing unit, a calculating unit, and a correcting unit. The executing unit executes a pre-scan while using a pulse sequence by which a plurality of echo signals are collected. The calculating unit calculates a phase difference between at least two echo signals of which a fluctuation of phase differences is stable and that are selected out of the plurality of echo signals collected during the pre-scan and are selected while excluding echo signals collected during an initial time period. The correcting unit that corrects a pulse sequence used for a main scan, based on the phase difference calculated by the calculating unit.

20 Claims, 7 Drawing Sheets

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from Japanese Patent Application No. 2010-121911, filed on May 27, 2010; and Japanese Patent Application No. 2011-093245, filed on Apr. 19, 2011, the entire contents of all of which are incorporated herein by reference.

FIELD

Embodiments described herein relate generally to a magnetic resonance imaging apparatus and a magnetic resonance imaging method.

BACKGROUND

As an image taking method related to magnetic resonance imaging apparatuses, a method called "Fast Spin Echo (FSE) method" is conventionally known. The FSE method is an image taking method by which a plurality of echo signals called an echo train are collected by applying a flip pulse to an examined subject and then sequentially applying a plurality of flop pulses to the examined subject. In this situation, the flip pulse is a Radio Frequency (RF) pulse used for exiting atomic nuclear spins within the examined subject. The flop pulses are RF pulses used for refocusing phases of the atomic nuclear spins.

According to the FSE method described above, because the plurality of RF pulses are applied, a stimulated echo is generated together with a spin echo. In some situations, the stimulated echo causes a phase shift in the collected echo signals. Such phase differences among the echo signals may be a cause of degradations of image quality such as sensitivity unevenness, lowering of signal strength, "ghost" phenomena, and the like.

To prevent such degradations of the image quality, generally speaking, a pre-scan for measuring the phase differences among the echo signals is performed prior to a main scan, so that a pulse sequence for the main scan can be corrected based on the phase differences measured during the pre-scan. In this situation, for example, a pulse sequence that cancels the stimulated echo is executed during the pre-scan so that only the spin echo is collected. Further, of the spin echo collected during the pre-scan, the first and the second echo signals are Fourier-transformed in a readout direction, so that a zero-order phase difference and a first-order phase difference between the first echo signal and the second echo signal can be calculated. After that, a correction amount is calculated so as to correct a readout direction phase shift and a slice selecting direction phase shift, based on the zero-order phase difference and the first-order phase difference being calculated. The pulse sequence for the main scan is changed, based on the calculated correction amount.

However, according to the conventional technique described above, the phase differences among the collected echo signals may vary in some situations, depending on the type of the image taking method being implemented. In those situations, there is a possibility that the pulse sequence used for the main scan may not be properly corrected and that the image quality may be degraded.

DETAILED DESCRIPTION

A magnetic resonance imaging apparatus according to an embodiment includes an executing unit, a calculating unit, and a correcting unit. The executing unit executes a pre-scan while using a pulse sequence by which a plurality of echo signals are collected. The calculating unit calculates a phase difference between at least two echo signals of which a fluctuation of phase differences is stable and that are selected out of the plurality of echo signals collected during the pre-scan and are selected while excluding echo signals collected during an initial time period. The correcting unit that corrects a pulse sequence used for a main scan, based on the phase difference calculated by the calculating unit.

In the following sections, exemplary embodiments of a magnetic resonance imaging apparatus and a magnetic resonance imaging method will be explained in detail, with reference to the accompanying drawings. In the description of the exemplary embodiments below, a magnetic resonance imaging apparatus will be referred to as an "MRI apparatus".

Figure 1:
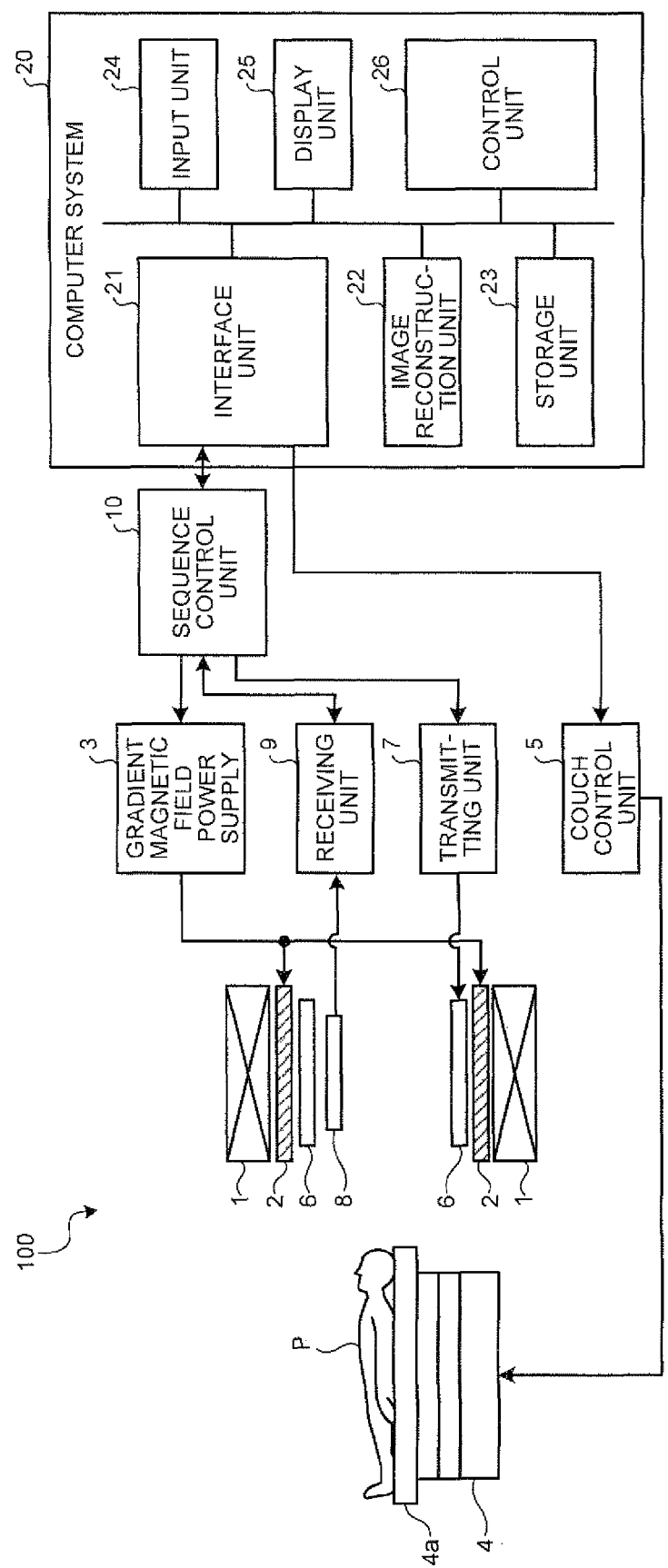
FIG. 1 is a diagram of a Magnetic Resonance Imaging (MRI) apparatus according to an embodiment.

FIG. 1 is a diagram of an MRI apparatus according to an embodiment. As shown in FIG. 1, an MRI apparatus 100 includes a static magnetic field magnet 1, a gradient coil 2, a gradient magnetic field power supply 3, a couch 4, a couch control unit 5, a transmission Radio Frequency (RF) coil 6, a transmitting unit 7, reception RF coil 8, a receiving unit 9, a sequence control unit 10, and a computer system 20.

The static magnetic field magnet 1 is a magnet formed in the shape of a hollow circular cylinder and generates a uniform static magnetic field in the space on the inside thereof. The static magnetic field magnet 1 may be configured by using, for example, a permanent magnet, a superconductive magnet, or the like.

The gradient coil 2 is a coil formed in the shape of a hollow circular cylinder and is disposed on the inside of the static magnetic field magnet 1. The gradient coil 2 is formed by combining three coils corresponding to X-, Y-, and Z-axes that are orthogonal to one another. These three coils individually receive a supply of electric current from the gradient magnetic field power supply 3 (explained later) and generate gradient magnetic fields of which the magnetic field intensities change along the X-, Y-, and Z-axes. It is assumed that the Z-axis direction is the same as the direction of the static magnetic field. The gradient magnetic field power supply 3 supplies the electric current to the gradient coil 2.

In this situation, the gradient magnetic fields on the X-, Y-, and Z-axes that are generated by the gradient coil 2 correspond to, for example, a slice selecting gradient magnetic field Gs which is used for slice selecting, a phase encoding gradient magnetic field Ge which is used for phase encoding, and a readout gradient magnetic field Gr which is used for readout, respectively. The slice selecting gradient magnetic field Gs is used for determining an imaging cross section in an arbitrary manner. The phase encoding gradient magnetic field Ge is used for changing the phase of a magnetic resonance signal according to a spatial position. The readout gradient magnetic field Gr is used for changing the frequency of a magnetic resonance signal according to a spatial position.

The couch 4 includes a couchtop 4a on which an examined subject P is placed. Under control of the couch control unit 5 (explained later), while the examined subject P is placed thereon, the couchtop 4a is inserted into the hollow (i.e., an image taking opening) of the gradient coil 2. Normally, the couch 4 is provided so that the longitudinal direction thereof extends parallel to the central axis of the static magnetic field magnet 1. The couch control unit 5 is a device that controls the couch 4, under control of a control unit 26. The couch control unit 5 drives the couch 4 so that the couchtop 4a moves in the longitudinal direction and in an up-and-down direction.

The transmission RF coil 6 is disposed on the inside of the gradient coil 2 and generates a high frequency magnetic field by receiving a supply of a high frequency pulse from the transmitting unit 7. The transmitting unit 7 transmits the high frequency pulse corresponding to a Larmor frequency to the transmission RF coil 6. The reception RF coil 8 is disposed on the inside of the gradient coil 2 and receives a magnetic resonance signal emitted from the examined subject P due to an influence of the high frequency magnetic field described above. When having received the magnetic resonance signal, the reception RF coil 8 outputs the received magnetic resonance signal to the receiving unit 9.

Based on the magnetic resonance signal being output from the reception RF coil 8, the receiving unit 9 generates magnetic resonance (MR) signal data. The receiving unit 9 generates the MR signal data by applying a digital conversion to the magnetic resonance signal being output from the reception RF coil 8. The MR signal data is brought into correspondence with information about spatial frequencies in a phase encoding direction, a readout direction, and a slice encoding direction by the slice selecting gradient magnetic field Gs, the phase encoding gradient magnetic field Ge, and the readout gradient magnetic field Gr described above and is disposed in a k-space. When having generated the MR signal data, the receiving unit 9 transmits the generated MR signal data to the sequence control unit 10.

The sequence control unit 10 performs a scanning process on the examined subject P, by driving the gradient magnetic field power supply 3, the transmitting unit 7, and the receiving unit 9, based on sequence execution data transmitted from the computer system 20. In this situation, the sequence execution data is information that defines a pulse sequence indicating a procedure for performing the scanning process on the examined subject P, such as the intensity of the electric power supply to be supplied by the gradient magnetic field power supply 3 to the gradient coil 2 and the timing with which the electric power supply is to be supplied; the strength of the RF signal to be transmitted by the transmitting unit 7 to the transmission RF coil 6 and the timing with which the RF signal is to be transmitted; and the timing with which the magnetic resonance signal is to be detected by the receiving unit 9. When the MR signal data is transmitted from the receiving unit 9 after the sequence control unit 10 drives the gradient magnetic field power supply 3, the transmitting unit 7, and the receiving unit 9 based on the sequence execution data, the sequence control unit 10 transfers the MR signal data to the computer system 20.

The computer system 20 exercises overall control of the MRI apparatus 100. For example, the computer system 20 performs the scanning process on the examined subject P and performs an image reconstruction process, by driving the constituent elements included in the MRI apparatus 100. The computer system 20 includes an interface unit 21, an image reconstruction unit 22, a storage unit 23, an input unit 24, a display unit 25, and the control unit 26.

The interface unit 21 controls inputs and outputs of various types of signals that are transmitted to and received from the sequence control unit 10. For example, the interface unit 21 transmits the sequence execution data to the sequence control unit 10 and receives the MR signal data from the sequence control unit 10. When having received the MR signal data, the interface unit 21 stores the received MR signal data into the storage unit 23, for each examined subject P.

The image reconstruction unit 22 generates spectrum data or image data corresponding to desired nuclear spins occurring within the examined subject P, by applying a post-processing process (i.e., a reconstruction process such as a Fourier transform) to the MR signal data stored in the storage unit 23.

The storage unit 23 stores therein various types of data and various types of computer programs that are required in processes (explained later) performed by the control unit 26. For example, the storage unit 23 stores therein, for each examined subject P, the MR signal data received by the interface unit 21, the spectrum data and/or the image data generated by the image reconstruction unit 22, and the like.

The input unit 24 receives various types of instructions and inputs of information from an operator of the MRI apparatus 100. For example, the input unit 24 may be configured by using any of the following as appropriate: a pointing device such as a mouse and/or a trackball; a selecting device such as a mode changing switch; and an input device such as a keyboard.

Under control of the control unit 26, the display unit 25 displays various types of information such as the spectrum data or the image data. The display unit 25 may be configured by using a display device such as a liquid crystal display monitor.

The control unit 26 includes a Central Processing Unit (CPU), a memory, and the like (not shown) and exercises overall control of the MRI apparatus 100. For example, the control unit 26 controls the scanning process by generating various types of sequence execution data based on an imaging condition that is input by the operator via the input unit 24 and transmitting the generated sequence execution data to the sequence control unit 10. Also, when the MR signal data is sent from the sequence control unit 10 as a result of the scanning process, the control unit 26 controls the image reconstruction unit 22 so that an image is restructured based on the MR signal data.

The configuration of the MRI apparatus 100 according to the present embodiment has thus been explained. The MRI apparatus 100 configured as described above performs a prescan while using a pulse sequence by which a plurality of echo signals are collected. Further, the MRI apparatus 100 calculates a phase difference between at least two echo signals of which the fluctuation of the phase differences is stable and that are selected out of the plurality of echo signals collected during the pre-scan and are selected while excluding the echo signals collected during an initial time period. Further, the MRI apparatus 100 corrects a pulse sequence for a main scan, based on the calculated phase difference.

In this situation, when an image taking process is performed while using a conventional FSE method together with, for example, a Variable Flip Angle (VFA) method, it has been known that the phase differences among the collected echo signals vary. The FSE method in this situation is an image taking method by which a plurality of echo signals called an echo train are collected by applying an flip pulse for excitation to an examined subject and then sequentially applying a plurality of flop pulses for refocusing to the examined subject. The VFA method in this situation is an image taking method by which a plurality of echo signals are collected while changing the flip angle of the flop pulses, by using a pulse sequence according to the FSE method.

Figure 2:
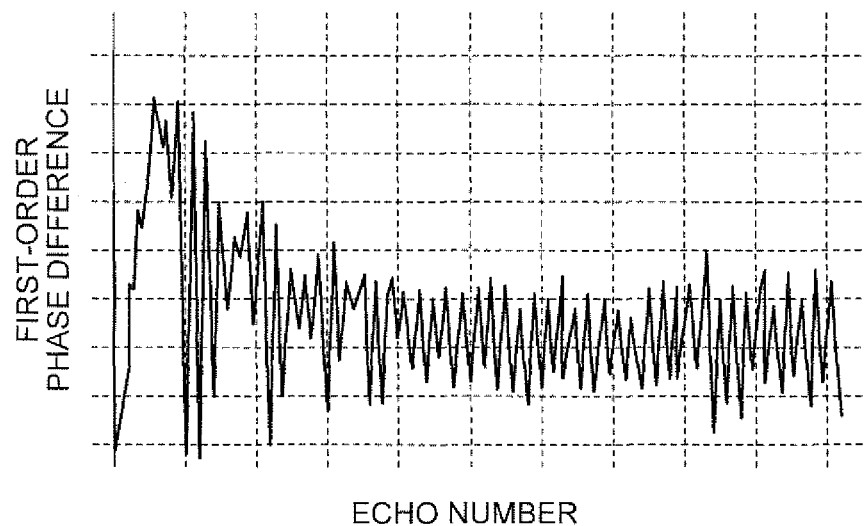
FIG. 2 is a chart for explaining a fluctuation of phase differences among echo signals collected by using a conventional Variable Flip Angle (VFA) method.
Figure 3:
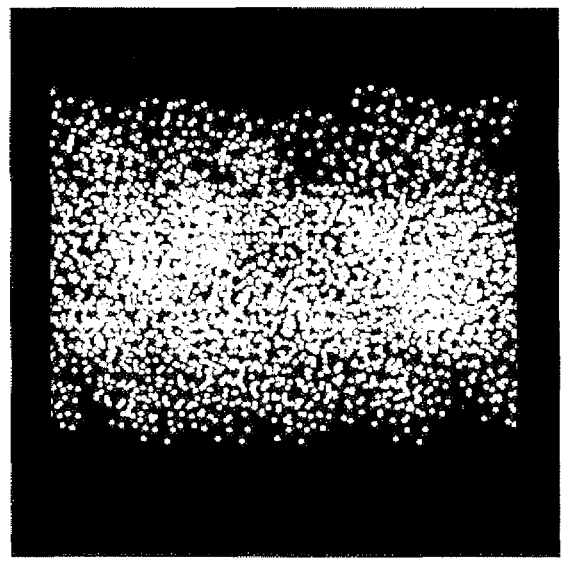
FIG. 3 is a drawing of an example of a phantom image taken by using the conventional VFA method.

FIG. 2 is a chart for explaining a fluctuation of phase differences among echo signals collected by using the conventional VFA method. In FIG. 2, an example of a fluctuation of first-order phase differences occurring in the readout direction among the echo signals collected by using the conventional VFA method is shown. FIG. 3 is a drawing of an example of a phantom image taken by using the conventional VFA method.

As shown in FIG. 2, when the conventional VFA method is used, the first-order phase difference largely fluctuates among the echo signals collected during an initial time period. In this situation, according to the conventional method, the first and the second echo signals among the echo signals collected during the pre-scan are used. For this reason, according to the conventional method, the pulse sequence for the main scan is corrected based on the echo signals of which the fluctuation of the phase differences is not stable. As a result, in some situations, the generated image has sensitivity unevenness, as shown in FIG. 3.

In contrast, when the MRI apparatus 100 according to the present embodiment is used, the pulse sequence for the main scan is corrected while using the echo signals of which the fluctuation of the phase differences is stable that are selected while excluding the echo signals collected during the initial time period. As a result, according to the present embodiment, even if an image taking method by which the phase differences among the echo signals vary is used, it is possible to prevent the image quality from being degraded by the varying phase differences. In the following sections, functions of the MRI apparatus 100 will be explained in detail. In the description of the present embodiment, an example in which an image taking process is performed by using the VFA method will be explained.

Figure 4:
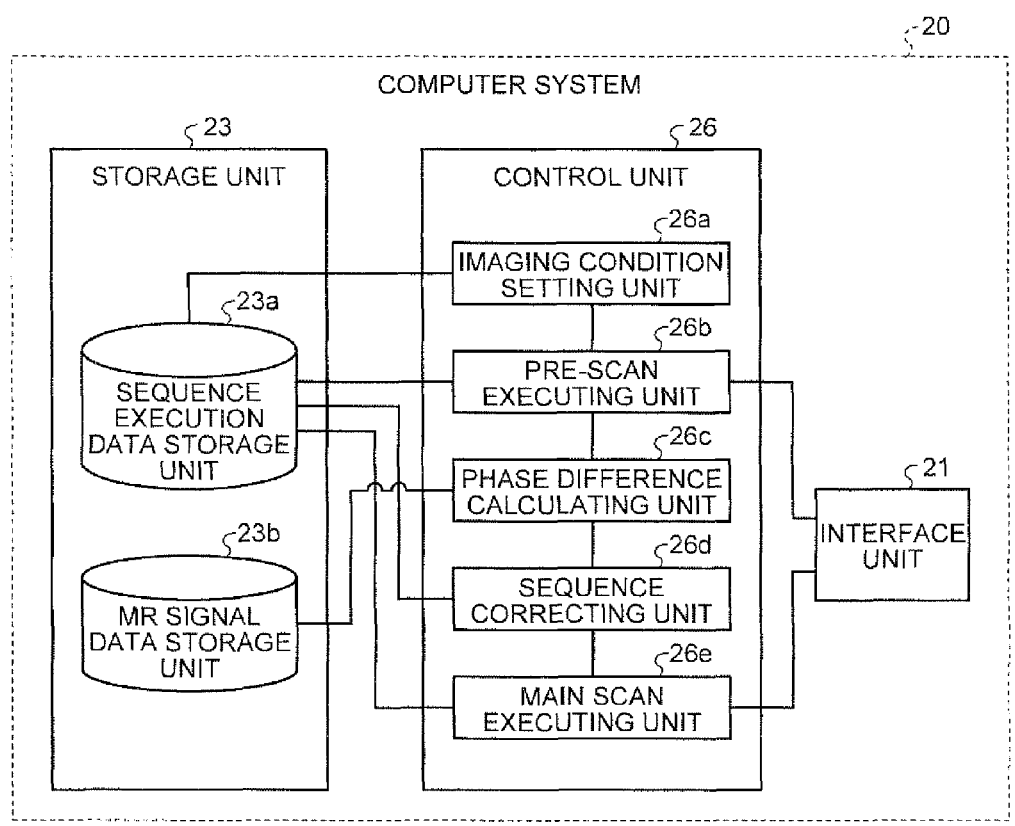
FIG. 4 is a functional block diagram of a detailed configuration of the computer system shown in FIG. 1.

FIG. 4 is a functional block diagram of a detailed configuration of the computer system 20 shown in FIG. 1. Of the functional units included in the computer system 20, in particular, the interface unit 21, the storage unit 23, and the control unit 26 are shown in FIG. 4.

The storage unit 23 includes a sequence execution data storage unit 23a and an MR signal data storage unit 23b. The sequence execution data storage unit 23a stores therein the sequence execution data generated by an imaging condition setting unit 26a (explained later). The MR signal data storage unit 23b stores therein the MR signal data received by the interface unit 21.

The control unit 26 includes the imaging condition setting unit 26a, a pre-scan executing unit 26b, a phase difference calculating unit 26c, a sequence correcting unit 26d, and a main scan executing unit 26e.

The imaging condition setting unit 26a generates the sequence execution data defining the pulse sequences used in the image taking process, based on the imaging condition being input by the operator via the input unit 24. For example, when an imaging condition that uses the VFA method is input by the operator, the imaging condition setting unit 26a generates sequence execution data defining a pulse sequence for a main scan that uses the VFA method and sequence execution data defining a pulse sequence for a pre-scan that uses the VFA method. For example, the imaging condition setting unit 26a generates the sequence execution data with respect to the pulse sequence used for the main scan and the sequence execution data with respect to the pulse sequence used for the pre-scan, which are explained below.

Figure 5:
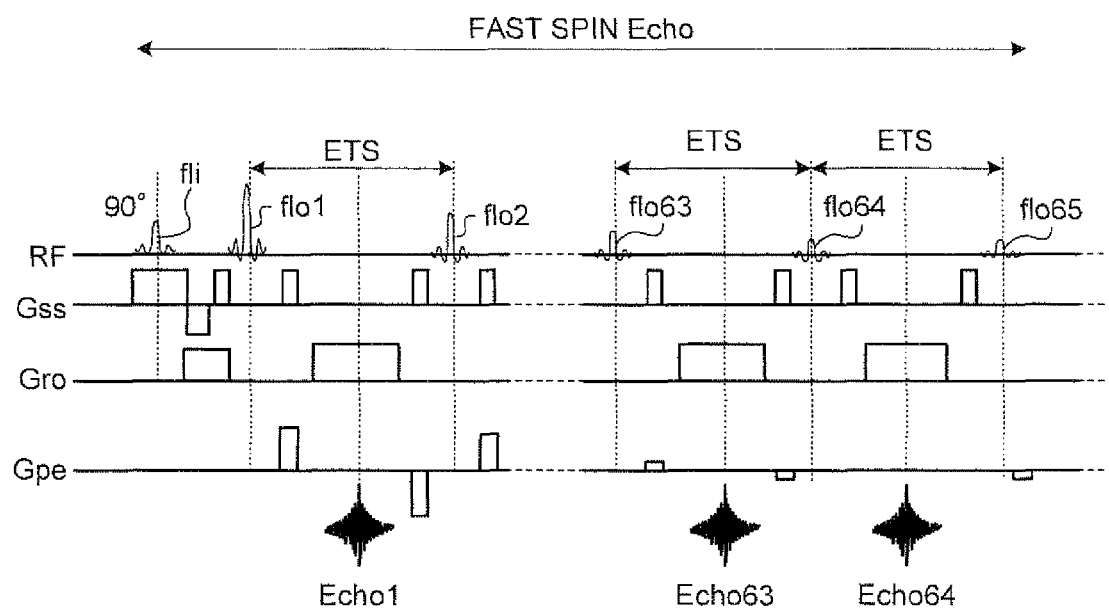
FIG. 5 is a chart of a pulse sequence for a main scan that uses a VFA method according to the present embodiment.
Figure 6:
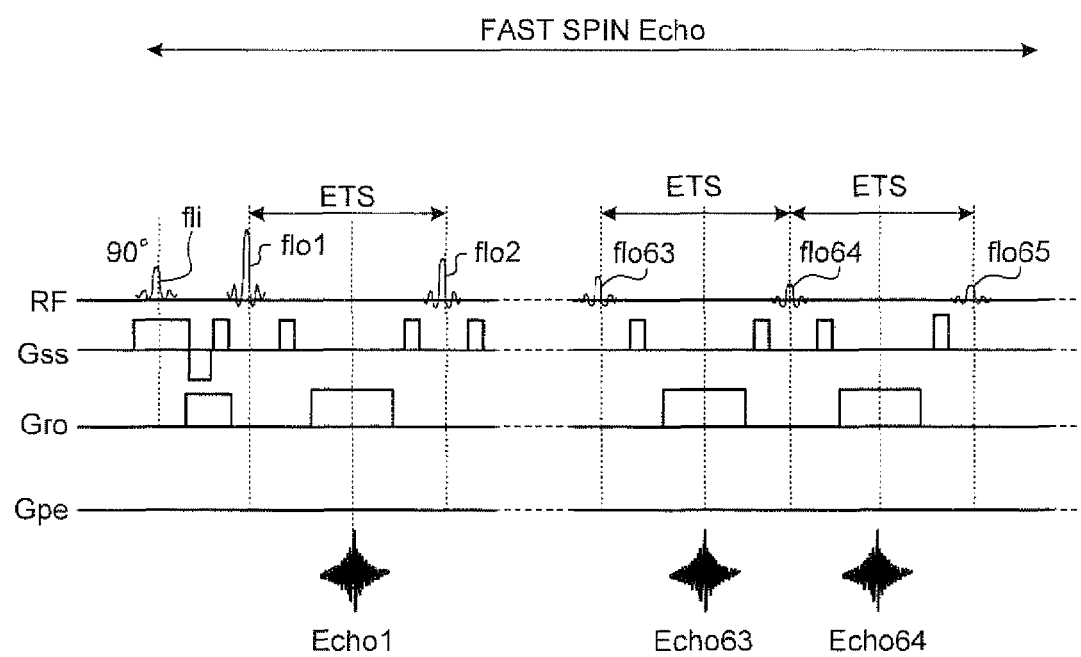
FIG. 6 is a chart of a pulse sequence for a pre-scan that uses the VFA method according to the present embodiment.

FIG. 5 is a chart of a pulse sequence for a main scan that uses the VFA method according to the present embodiment. FIG. 6 is a chart of a pulse sequence for a pre-scan that uses the VFA method according to the present embodiment. In FIGS. 5 and 6, "RF" indicates timing with which an flip pulse "fli" and flop pulses "flo1", "flo2", . . . , "flo63", "flo64" . . . are applied. Further, "Gss" indicates timing with which the slice selecting gradient magnetic field is applied and the intensity thereof. "Gro" indicates timing with which the readout gradient magnetic field is applied and the intensity thereof. "Gpe" indicates timing with which the phase encoding gradient magnetic field is applied and the intensity thereof. Further, "Echo1" denotes the first echo signal collected. "Echo63" denotes the 63rd echo signal collected. "Echo64" denotes the 64th echo signal collected. In FIGS. 5 and 6, only pulse sequences related to one slice selection is shown, and the slice encoding is omitted from the drawings. Further, "Echo Train Spacing (ETS)" denotes an echo interval.

First, as shown in FIG. 5, the pulse sequence for the main scan according to the present embodiment is a pulse sequence that uses the FSE method and by which a plurality of echo signals are collected while changing the flip angle of the flop pulses. The pulse sequence shown in FIG. 5 is an example in which an arrangement is made so that the phase encoding number is 128 and so that the phase encoding gradient magnetic field becomes equal to zero with respect to the 64th echo signal collected among 128 echo signals.

In contrast, as shown in FIG. 6, the pulse sequence for the pre-scan according to the present embodiment is obtained by arranging the pulse sequence for the main scan shown in FIG. 5 so that the phase encoding gradient magnetic field is not applied. Further, the pulse sequence for the pre-scan according to the present embodiment is set so that the stimulated echo is cancelled and so that only a spin echo is collected. For example, a method described in U.S. Pat. No. 5,818,229 may be used. According to this method, it is possible to extract a spin echo component by adding together first-shot echo signals that are collected while changing the phase of the flop pulses in the manner of "π, π, π, π, . . . " and second-shot echo signals that are collected while changing the phase of the flop pulses in the manner of "π, −π, π, −π, . . . ".

Returning to the description of FIG. 4, the pre-scan executing unit 26b performs the pre-scan while using the pulse sequence by which a plurality of echo signals are collected. For example, the pre-scan executing unit 26b performs the pre-scan while using the pulse sequence by which a plurality of echo signals are collected without applying the phase encoding gradient magnetic field. In the present example, a situation is explained in which the pulse sequence by which the plurality of echo signals are collected without applying the phase encoding gradient magnetic field is used as the pulse sequence for the pre-scan; however, a pulse sequence by which the phase encoding gradient magnetic field is applied may be used instead as the pulse sequence for the pre-scan.

More specifically, when the sequence execution data for the pre-scan is generated by the imaging condition setting unit 26a, the pre-scan executing unit 26b reads the sequence execution data from the sequence execution data storage unit 23a. Further, the pre-scan executing unit 26b transmits the read sequence execution data to the sequence control unit 10 via the interface unit 21 so as to execute the pre-scan. For example, the pre-scan executing unit 26b transmits the sequence execution data defining the pulse sequence shown in FIG. 6 to the sequence control unit 10 so as to execute the pre-scan.

The phase difference calculating unit 26c calculates a phase difference between at least two echo signals of which the fluctuation of the phase differences is stable and that are selected out of the plurality of echo signals collected during the pre-scan and are selected while excluding the echo signals collected during the initial time period. More specifically, after the pre-scan is performed by the pre-scan executing unit 26b, the phase difference calculating unit 26c reads, out of the MR signal data storage unit 23b, MR signal data related to at least two echo signals of which the fluctuation of the phase differences is stable and that are selected out of the echo signals collected during the pre-scan and are selected while excluding the echo signals collected during the initial time period. The phase difference calculating unit 26c then causes the read MR signals to be Fourier-transformed in the readout direction and calculates a zero-order phase difference and a first-order phase difference.

According to the FSE method, a dephasing amount generated by the phase encoding gradient magnetic field applied to a preceding echo signal is added to an immediately following echo signal, so that a phase difference occurs in the echo observed next. Because the phase difference can be expressed by using a linear function (i.e., a first-order function) of the location, the phase difference is referred to as the "first-order phase difference". Further, a gradient magnetic field contains a zero-order term (i.e., a BO component) due to misalignments in positional arrangements of the coils. Although the zero-order term of the gradient magnetic field is a uniform component having no dependency on the location, the zero-order term has a time-related characteristic where the value thereof decreases exponentially like an eddy current eventually and may be a cause of phase differences. This phase difference is referred to as the "zero-order phase difference". The first-order phase difference denotes a phase shift in the readout direction, whereas the zero-order phase difference denotes a phase shift in the slice selecting direction (i.e., the zero-order term caused by the misalignments in the positional arrangements of the coils or the like).

For example, as the echo signals of which the fluctuation of the phase differences is stable and that are selected while excluding the echo signals collected during the initial time period, the phase difference calculating unit 26c uses the echo signals that are collected during a time period that is the same as or close to the time period during which the phase encoding gradient magnetic field is equal to zero in the main scan.

To explain a more specific example, let us assume that, for instance, the pulse sequence shown in FIG. 5 is used in the main scan, whereas the pulse sequence shown in FIG. 6 is used in the pre-scan. Like the pulse sequence shown in FIG. 5, when an arrangement is made so that the phase encoding number is 128 and so that the phase encoding gradient magnetic field is equal to zero with respect to the 64th echo signal collected, generally speaking, it requires approximately forty-eight echo signals for the fluctuation of the phase differences among the echo signals to become stable (see FIG. 2). Also, as for the echo signals used for correcting the phase differences, it is desirable to use echo signals positioned at the center of the k-space that contribute the most to the image quality. In this situation, for example, the phase difference calculating unit 26c calculates a phase difference between the 64th echo signal and the 63rd echo signal that are collected during the pre-scan. Alternatively, the phase difference calculating unit 26c may calculate a phase difference between the 64th echo signal and the 65th echo signal that are collected during the pre-scan.

The sequence correcting unit 26d corrects the pulse sequence for the main scan, based on the phase difference calculated by the phase difference calculating unit 26c. More specifically, when the phase difference is calculated by the phase difference calculating unit 26c, the sequence correcting unit 26d changes the sequence execution data for the main scan that is stored in the sequence execution data storage unit 23a, based on the calculated phase difference.

In this situation, the sequence correcting unit 26d changes the intensity of the readout gradient magnetic field in the pulse sequence for the main scan in such a manner that the first-order phase difference calculated by the phase difference calculating unit 26c becomes equal to zero. Also, the sequence correcting unit 26d changes the phases of the flop pulses in the pulse sequence for the main scan in such a manner that the zero-order phase difference calculated by the phase difference calculating unit 26c becomes equal to zero. Alternatively, the sequence correcting unit 26d may change the intensity of the slice selecting gradient magnetic field in the pulse sequence for the main scan in such a manner that the zero-order phase difference calculated by the phase difference calculating unit 26c becomes equal to zero.

The main scan executing unit 26e performs the main scan by using the pulse sequence for the main scan corrected by the sequence correcting unit 26d. More specifically, when the sequence execution data for the main scan is corrected by the sequence correcting unit 26d, the main scan executing unit 26e reads the corrected sequence execution data from the sequence execution data storage unit 23a. Subsequently, the main scan executing unit 26e transmits the read sequence execution data to the sequence control unit 10 via the interface unit 21, so as to perform the main scan.

Figure 8:
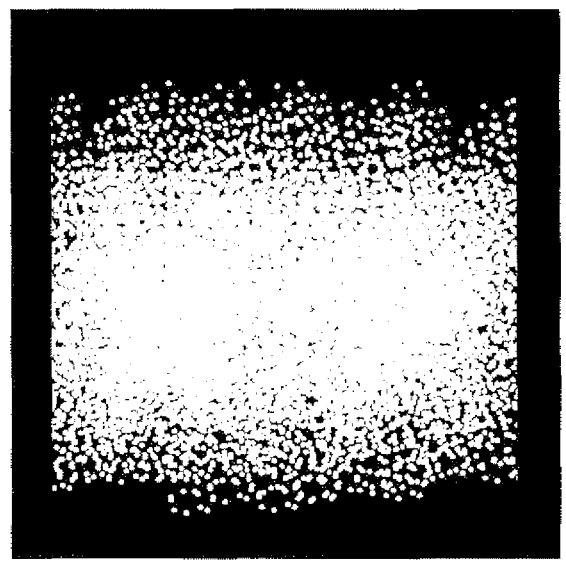
FIG. 8 is a drawing of an example of a phantom image obtained by using the MRI apparatus according to the present embodiment.

In this situation, because the main scan executing unit 26e performs the main scan by using the corrected pulse sequence, it is possible to prevent the image quality from being degraded, even if the image taking method being implemented is one by which the phase differences among the echo signals vary. FIG. 8 is a drawing of an example of a phantom image obtained by using the MRI apparatus 100 according to the present embodiment. As shown in FIG. 8, when the MRI apparatus 100 according to the present embodiment is used, it is possible to obtain an image having less sensitivity unevenness than the image shown in FIG. 3 that is obtained by using the conventional VFA method.

Figure 7:
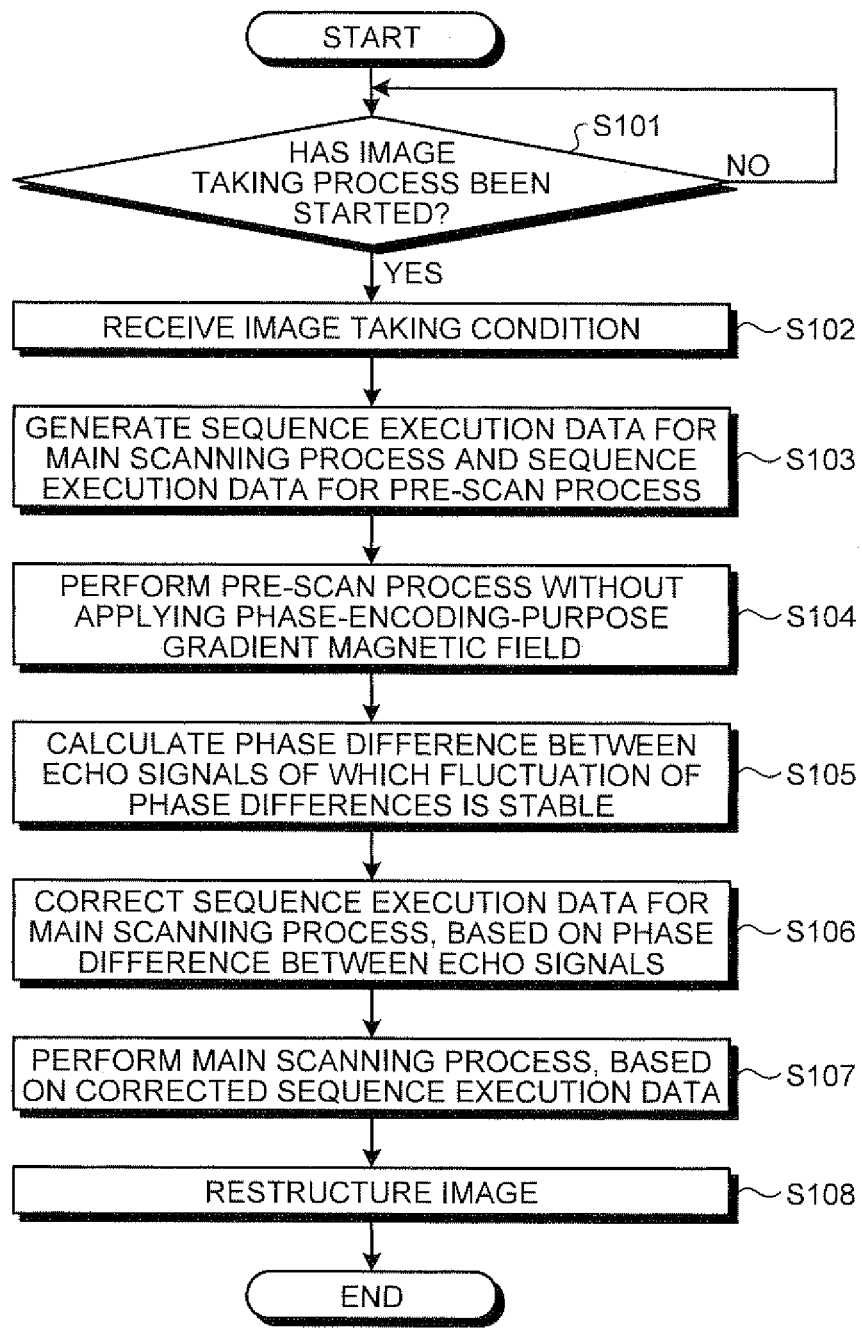
FIG. 7 is a flowchart of a processing procedure in a phase difference correcting process performed by the MRI apparatus according to the present embodiment.

Next, a processing procedure in the phase difference correcting process performed by the MRI apparatus 100 according to the present embodiment will be explained. FIG. 7 is a flowchart of the processing procedure in the phase difference correcting process performed by the MRI apparatus 100 according to the present embodiment.

As shown in FIG. 7, the MRI apparatus 100 according to the present embodiment is configured so that, when the operator instructs that an image taking process should be started (step S101: Yes), the imaging condition setting unit 26a receives an input of an imaging condition from the operator via the input unit 24 (step S102).

Subsequently, the imaging condition setting unit 26a generates sequence execution data for a pre-scan and sequence execution data for a main scan, based on the imaging condition being input by the operator (step S103). In this situation, the imaging condition setting unit 26a generates the sequence execution data for the pre-scan in such a manner that a plurality of echo signals are to be collected without applying a phase encoding gradient magnetic field.

Subsequently, the pre-scan executing unit 26b performs the pre-scan without applying the phase encoding gradient magnetic field, based on the sequence execution data for the pre-scan generated by the imaging condition setting unit 26a (step S104). After that, the phase difference calculating unit 26c calculates a phase difference between the echo signals of which the fluctuation of the phase differences is stable and that are selected out of the plurality of echo signals collected during the pre-scan (step S105).

Subsequently, the sequence correcting unit 26d corrects the sequence execution data for the main scan, based on the phase difference between the echo signals calculated by the phase difference calculating unit 26c (step S106). After that, the main scan executing unit 26e performs the main scan, based on the sequence execution data for the main scan corrected by the sequence correcting unit 26d (step S107). Subsequently, the image reconstruction unit 22 restructures an image from the MR signal data collected during the main scan (step S108).

As explained above, according to the present embodiment, the pre-scan executing unit 26b performs the pre-scan while using the pulse sequence by which the plurality of echo signals are collected without applying the phase encoding gradient magnetic field. Also, the phase difference calculating unit 26c calculates the phase difference between the two or more echo signals of which the fluctuation of the phase differences is stable and that are selected out of the plurality of echo signals collected during the pre-scan and are selected while excluding the echo signals collected during the initial time period. Further, the sequence correcting unit 26d corrects the pulse sequence for the main scan, based on the phase difference between the echo signals calculated by the phase difference calculating unit 26c. With these arrangements, according to the present embodiment, even if the image taking method being implemented is one by which the phase differences among the echo signals vary, it is possible to prevent the image quality from being degraded by the varying phase differences.

In addition, according to the present embodiment, the phase difference calculating unit 26c uses, as the echo signals of which the fluctuation of the phase differences is stable, the echo signals that are collected during a time period that is the same as or close to the time period during which the phase encoding gradient magnetic field is equal to zero in the main scan. With this arrangement, according to the present embodiment, the pulse sequence for the main scan is corrected based on the echo signals positioned at the center of the k-space that contribute the most to the image quality. It is therefore possible to further improve the image quality.

Furthermore, according to the present embodiment, each of the pulse sequences used for the pre-scan and for the main scan is a pulse sequence that uses the FSE method and by which the plurality of echo signals are collected while changing the flip angle of the RF pulses for refocusing. With this arrangement, according to the present embodiment, when an image taking process is performed by using the VFA method and even if the phase differences vary among the echo signals collected during the initial time period, with regard to the plurality of echo signals collected during the pre-scan, it is possible to prevent the image quality from being degraded.

In the description of the present embodiment above, the example is explained in which the echo signals that are collected during the time period that is the same as or close to the time period during which the phase encoding gradient magnetic field is equal to zero in the main scan are used as the echo signals of which the fluctuation of the phase differences is stable; however, technical features according to the present embodiment are not limited to this example. For instance, another arrangement is acceptable in which the phase difference calculating unit 26c uses, as the echo signals of which the fluctuation of the phase differences is stable, echo signals of which the magnitude of the fluctuation of the phase differences is equal to or smaller than a predetermined threshold value. In this situation, by changing the threshold value, for example, the operator is able to change the degree of the phase differences between the echo signals used for correcting the pulse sequence for the main scan. As a result, the operator is able to adjust the level of precision of the phase difference correcting process.

Further, in the description of the present embodiment above, the example is explained in which the echo signals that are collected during the time period that is the same as or close to the time period during which the phase encoding gradient magnetic field is equal to zero in the main scan are used as the echo signals of which the fluctuation of the phase differences is stable; however, the technical features according to the present embodiment are not limited to this example. Examples of image taking methods that can be used by MRI apparatuses include methods (e.g., methods for taking proton density weighted images, $T_1$ weighted images, and the like) by which the number of echo signals that are collected before the intensity of the phase encoding gradient magnetic field becomes equal to zero is small. When one of such image taking methods is used, there may be a situation in which the phase differences between the echo signals is not yet stable even during the time period when the intensity of the phase encoding gradient magnetic field is equal to zero.

To cope with this situation, another arrangement is acceptable in which, for example, the phase difference calculating unit 26c calculates an average value of the phase differences among a plurality of echo signals of which the fluctuation of the phase differences is stable. In that situation, the sequence correcting unit 26d corrects the pulse sequence for the main scan, based on the average value of the phase differences calculated by the phase difference calculating unit 26c. For example, when the intensity of the phase encoding gradient magnetic field becomes equal to zero with respect to an n'th echo signal, the phase difference calculating unit 26c calculates the average value of the phase differences by calculating $(difn+difn1+difn2+ \ldots)/N$, where difn denotes the phase difference between the n'th echo signal and the (n+1)th echo signal; difn1 denotes the phase difference between the (n+2)th echo signal and the (n+1)th echo signal; difn2 denotes the phase difference between the (n+2)th echo signal and the (n+3)th echo signal; and so on. In this expression, N denotes the number of echo signals used in the calculation of the phase differences. With this arrangement, for example, even if the image taking method being implemented is one by which the number of echo signals that are collected before the intensity of the phase encoding gradient magnetic field becomes equal to zero is small, it is possible to correct the pulse sequence for the main scan with a high level of precision.

Further, in the description of the present embodiment above, the example is explained in which both of the pulse sequences used for the pre-scan and for the main scan are each a pulse sequence that uses the VIA method; however, the technical features according to the present embodiment are not limited to this example. For example, another arrangement is acceptable in which a pulse sequence that uses the VFA method is used for the main scan, whereas a pulse sequence that uses a Constant Flip Angle (CFA) method is used for the pre-scan. In this situation, the pre-scan executing unit 26b performs the pre-scan by using the pulse sequence that uses the CFA method. Further, the main scan executing unit 26e performs the main scan by using the pulse sequence that uses the VIA method.

Figure 9:
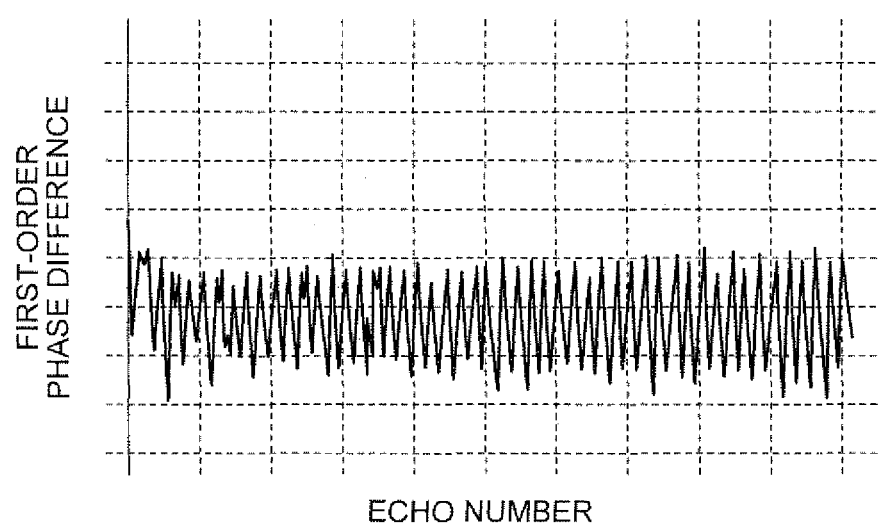
FIG. 9 is a chart of an example of a pulse sequence that uses a Constant Flip Angle (CFA) method according to a modification example of the present embodiment.

The CFA method mentioned above is an image taking method by which, with a pulse sequence according to the FSE method, a plurality of echo signals are collected while keeping the flip angle of the flop pulses constant. FIG. 9 is a chart of an example of a pulse sequence that uses the CFA method according to a modification example of the present embodiment. In FIG. 9, an example of the fluctuation of the first-order phase differences among echo signals collected by using the CFA method is shown. As shown in FIG. 9, when the CFA method is used, the first-order phase differences among the echo signals are substantially stable throughout the entirety.

In that situation, for example, the flip angle of the flop pulses in the pulse sequence for the pre-scan is set so as to be equal to the flip angle of the first flop pulse applied in the pulse sequence for the main scan. Further, as the echo signal of which the fluctuation of the phase differences is stable, the phase difference calculating unit 26c uses the echo signals collected during the initial time period that are selected out of the echo signals collected during the pre-scan. By using the echo signals collected during the initial time period, it is possible to correct the pulse sequence for the main scan with a high level of precision, even in the situation where, for example, the noise component included in the echo signals becomes larger as the number of echo signals increases. Generally speaking, it is anticipated that an image taking process performed by using the CFA method has a high Specific Absorption Rate (SAR); however, because the execution time period of the pre-scan is shorter than that of the main scan, the impact of using the pulse sequence according to the CFA method is small.

Further, in the description of the present embodiment above, the example is explained in which the phase difference calculating unit 26c uses, as the echo signals of which the fluctuation of the phase differences is stable and that are selected while excluding the echo signals collected during the initial time period, the echo signals that are collected during the time period that is the same as or close to the time period during which the phase encoding gradient magnetic field is equal to zero in the main scan; however, the embodiments are not limited to this example. As long as the echo signals are such echo signals of which the fluctuation of the phase differences is stable and that are selected while excluding the echo signals collected during the initial time period, it is acceptable to use echo signals that are collected in any other periods.

Figure 10:
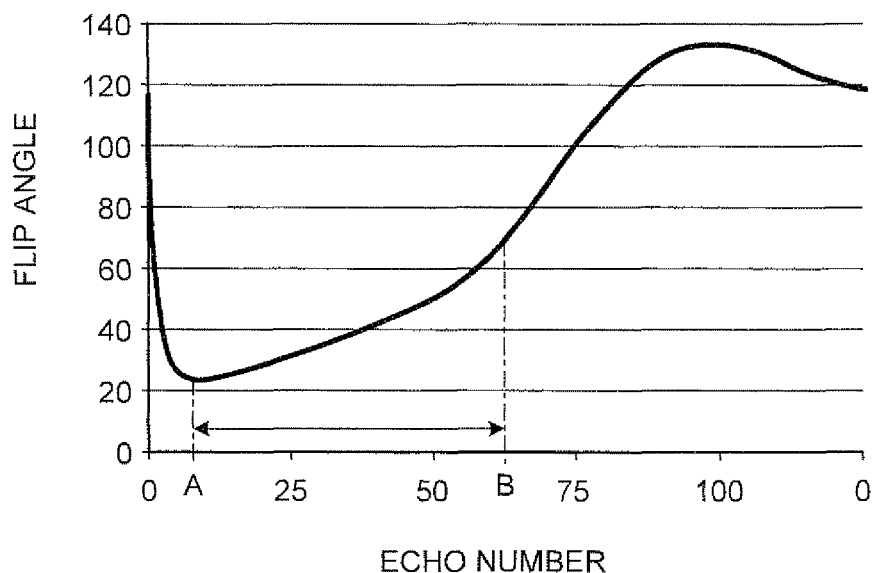
FIGS. 10 and 11 are charts for explaining other modification examples of the present embodiment.
Figure 11:
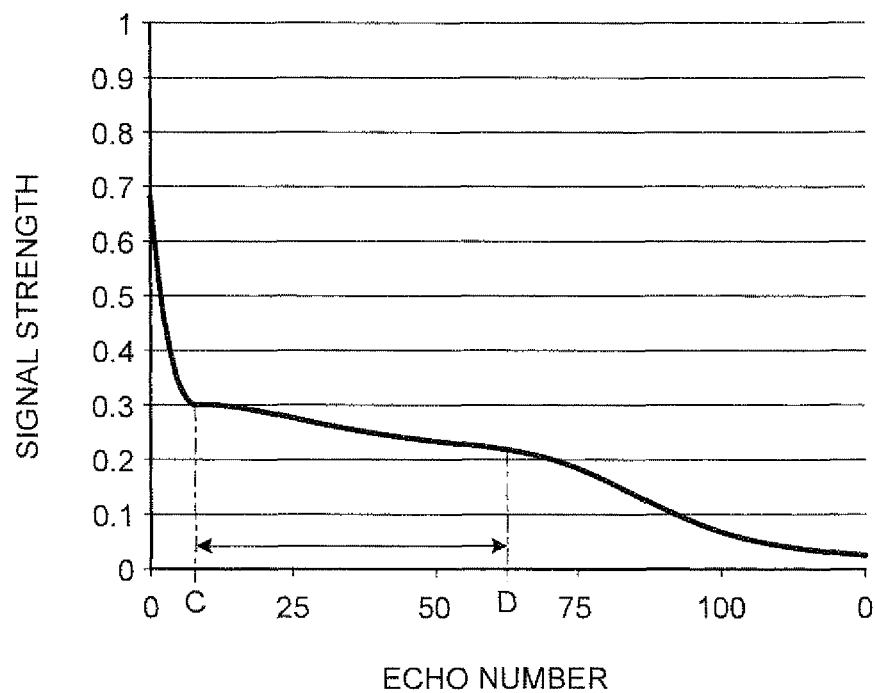

FIGS. 10 and 11 are charts for explaining other modification examples of the present embodiment. In FIG. 10, an example of changes in the flip angle for each of the echo signals in a pulse sequence for a pre-scan is shown. In FIG. 11, an example of changes in the signal strength for each of the echo signals collected during a pre-scan is shown.

For example, out of the plurality of echo signals collected during the pre-scan, the phase difference calculating unit 26c may use the echo signals that are collected after a point in time at which the change amount of the flip angle of the RF pulses for refocusing in the pulse sequence for the pre-scan changes from a decrease to an increase. In that situation, for example, the phase difference calculating unit 26c uses at least two echo signals selected out of the plurality of echo signals that are collected after the point in time at which the change amount of the flip angle of the RF pulses for refocusing changes from a decrease to an increase, the plurality of signals namely being, as shown in FIG. 10, echo signals from an echo signal A to an echo signal B (i.e., the echo signal positioned at the center of the k-space) with which the phase encoding gradient magnetic field becomes equal to zero in the main scan.

Alternatively, for example, out of the plurality of echo signals collected during the pre-scan, the phase difference calculating unit 26c may use the echo signals that are collected after a point in time at which the change amount of the signal strength for each echo has become equal to or smaller than a predetermined signal threshold value. In that situation, for example, the phase difference calculating unit 26c uses at least two echo signals selected out of the plurality of echo signals that are collected after the point in time at which the change amount of the signal strength for each echo has become equal to or smaller than the predetermined signal threshold value, the plurality of signals namely being, as shown in FIG. 11, echo signals from an echo signal C to an echo signal D (i.e., the echo signal positioned at the center of the k-space) with which the phase encoding gradient magnetic field becomes equal to zero in the main scan. The signal threshold value used in this situation may be, for example, a value obtained by multiplying the change amount between the echo signal positioned at the center of the k-space and the immediately preceding or immediately following echo signal by a predetermined coefficient.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
   an executing unit that executes a pre-scan while using a pulse sequence by which a plurality of echo signals are collected;
   a calculating unit that calculates a phase difference between at least two echo signals of which a fluctuation of phase differences is stable and that are selected out of the plurality of echo signals collected during the pre-scan and are selected while excluding echo signals collected during an initial time period; and
   a correcting unit that corrects a pulse sequence used for a main scan, based on the phase difference calculated by the calculating unit.

2. The magnetic resonance imaging apparatus according to claim 1, wherein, out of the plurality of echo signals, the calculating unit uses echo signals that are collected after a point in time at which a change amount of a flip angle of a refocusing radio frequency pulse in the pulse sequence for the pre-scan changes from a decrease to an increase.

3. The magnetic resonance imaging apparatus according to claim 1, wherein, out of the plurality of echo signals, the calculating unit uses echo signals that are collected after a point in time at which a change amount of a signal strength for each echo has become equal to or smaller than a predetermined signal threshold value.

4. The magnetic resonance imaging apparatus according to claim 1, wherein, as the echo signals of which the fluctuation of the phase differences is stable, the calculating unit uses echo signals that are collected during a time period that is same as or close to a time period during which a phase encoding gradient magnetic field is equal to zero in the main scan.

5. The magnetic resonance imaging apparatus according to claim 1, wherein, as the echo signals of which the fluctuation of the phase differences is stable, the calculating unit uses echo signals of which a magnitude of the fluctuation of the phase differences is equal to or smaller than a predetermined threshold value.

6. The magnetic resonance imaging apparatus according to claim 1, wherein
the calculating unit calculates an average value of the phase differences among the plurality of echo signals of which the fluctuation of the phase differences is stable, and
the correcting unit corrects the pulse sequence used for the main scan, based on the average value of the phase differences calculated by the calculating unit.

7. The magnetic resonance imaging apparatus according to claim 2, wherein
the calculating unit calculates an average value of the phase differences among the plurality of echo signals of which the fluctuation of the phase differences is stable, and
the correcting unit corrects the pulse sequence used for the main scan, based on the average value of the phase differences calculated by the calculating unit.

8. The magnetic resonance imaging apparatus according to claim 3, wherein
the calculating unit calculates an average value of the phase differences among the plurality of echo signals of which the fluctuation of the phase differences is stable, and
the correcting unit corrects the pulse sequence used for the main scan, based on the average value of the phase differences calculated by the calculating unit.

9. The magnetic resonance imaging apparatus according to claim 4, wherein
the calculating unit calculates an average value of phase differences among the plurality of echo signals of which the fluctuation of the phase differences is stable, and
the correcting unit corrects the pulse sequence used for the main scan, based on the average value of the phase differences calculated by the calculating unit.

10. The magnetic resonance imaging apparatus according to claim 1, wherein each of the pulse sequences used for the pre-scan and for the main scan is a pulse sequence that uses a fast spin echo method and by which a plurality of echo signals are collected while changing a flip angle of a refocusing radio frequency pulse.

11. The magnetic resonance imaging apparatus according to claim 2, wherein each of the pulse sequences used for the pre-scan and for the main scan is a pulse sequence that uses a fast spin echo method and by which a plurality of echo signals are collected while changing a flip angle of a refocusing radio frequency pulse.

12. The magnetic resonance imaging apparatus according to claim 3, wherein each of the pulse sequences used for the pre-scan and for the main scan is a pulse sequence that uses a fast spin echo method and by which a plurality of echo signals are collected while changing a flip angle of a refocusing radio frequency pulse.

13. The magnetic resonance imaging apparatus according to claim 4, wherein each of the pulse sequences used for the pre-scan and for the main scan is a pulse sequence that uses a fast spin echo method and by which a plurality of echo signals are collected while changing a flip angle of a refocusing radio frequency pulse.

14. The magnetic resonance imaging apparatus according to claim 1, wherein the correcting unit changes an intensity of a readout gradient magnetic field in the pulse sequence used for the main scan.

15. The magnetic resonance imaging apparatus according to claim 2, wherein the correcting unit changes an intensity of a readout gradient magnetic field in the pulse sequence used for the main scan.

16. The magnetic resonance imaging apparatus according to claim 3, wherein the correcting unit changes an intensity of a readout gradient magnetic field in the pulse sequence used for the main scan.

17. The magnetic resonance imaging apparatus according to claim 4, wherein the correcting unit changes an intensity of a readout gradient magnetic field in the pulse sequence used for the main scan.

18. The magnetic resonance imaging apparatus according to claim 1, wherein the correcting unit changes a phase of a refocusing radio frequency pulse in the pulse sequence used for the main scan.

19. A magnetic resonance imaging apparatus comprising:
an executing unit that executes a pre-scan while using a pulse sequence by which a plurality of echo signals are collected;
a calculating unit that calculates a phase difference between at least two echo signals of which a fluctuation of phase differences is stable and that are selected out of the plurality of echo signals collected during the pre-scan and are selected while excluding echo signals collected during an initial time period; and
a correcting unit that corrects a pulse sequence used for a main scan, based on the phase difference calculated by the calculating unit, wherein
the pulse sequence used for the main scan is a pulse sequence that uses a fast spin echo method and by which a plurality of echo signals are collected while changing a flip angle of a refocusing radio frequency pulse.

20. A magnetic resonance imaging method comprising:
executing a pre-scan while using a pulse sequence by which a plurality of echo signals are collected;
calculating a phase difference between at least two echo signals of which a fluctuation of phase differences is stable and that are selected out of the plurality of echo signals collected during the pre-scan and are selected while excluding echo signals collected during an initial time period; and
correcting a pulse sequence used for a main scan, based on the calculated phase difference.

* * * * *